US009508576B2

(12) United States Patent
Newman et al.

(10) Patent No.: US 9,508,576 B2
(45) Date of Patent: Nov. 29, 2016

(54) PROCESS EQUIPMENT ARCHITECTURE

(75) Inventors: Jacob Newman, Palo Alto, CA (US); Dinesh Kanawade, Sunnyvale, CA (US); Miriam Schwartz, Los Gatos, CA (US); Nir Merry, Mountain View, CA (US); Michael Thomas Haag, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 680 days.

(21) Appl. No.: 13/486,960

(22) Filed: Jun. 1, 2012

(65) Prior Publication Data
US 2012/0235339 A1 Sep. 20, 2012

Related U.S. Application Data

(62) Division of application No. 12/266,970, filed on Nov. 7, 2008, now abandoned.

(51) Int. Cl.
*H01L 21/67* (2006.01)
(52) U.S. Cl.
CPC ................. *H01L 21/6719* (2013.01)
(58) Field of Classification Search
CPC .................................... H01L 21/6719
See application file for complete search history.

(56) References Cited

U.S. PATENT DOCUMENTS

| 4,667,579 | A | * | 5/1987 | Daw .......................... 454/187 |
| 6,312,525 | B1 | | 11/2001 | Bright et al. |
| 6,486,444 | B1 | | 11/2002 | Fairbairn et al. |
| 2001/0022188 | A1 | | 9/2001 | Davis et al. |
| 2003/0073323 | A1 | | 4/2003 | Kim et al. |
| 2003/0186554 | A1 | | 10/2003 | Tam et al. |
| 2006/0240680 | A1 | | 10/2006 | Yokota et al. |

FOREIGN PATENT DOCUMENTS

JP 2001-023872 1/2001

OTHER PUBLICATIONS

PCT International Search Report and Written Opinion dated May 24, 2010 for International Application No. PCT/US2009/063568.

* cited by examiner

*Primary Examiner* — Dah-Wei D Yuan
*Assistant Examiner* — Stephen Kitt
(74) *Attorney, Agent, or Firm* — Patterson & Sheridan, LLP

(57) ABSTRACT

Embodiments of the present invention relate to improvements to single-substrate, multi-chamber processing platform architecture for minimizing fabrication facility floor space requirements. Prior art systems require significant floor space around all sides to allow for adequate installation and servicing. Embodiments of the present invention provide platforms that allow for servicing the chambers and supporting systems via a front and rear of the platform allowing multiple, side-by-side platform placement within a fabrication facility, while providing improved serviceability of the platform components.

12 Claims, 6 Drawing Sheets

PROCESS EQUIPMENT ARCHITECTURE

CROSS-REFERENCE TO RELATED APPLICATIONS

This application is a divisional application of co-pending U.S. patent application Ser. No. 12/266,970, filed on Nov. 7, 2008, which is herein incorporated by reference.

BACKGROUND OF THE INVENTION

1. Field of the Invention

Embodiments of the present invention generally relate to substrate processing equipment. In particular, embodiments of the present invention relate to single-substrate, multi-chamber platform architecture improvements for minimizing fabrication facility floor space requirements.

2. Description of the Related Art

As the semiconductor device fabrication industry continues to mature, fabrication facilities are continually looking for ways to increase throughput, while minimizing the amount of clean room floor space required. Traditional semiconductor substrate processing platforms include multiple, single-substrate processing chambers connected to a central transfer chamber. Such systems work well, but they require a significant amount of floor space to operate and maintain. Additionally, their size requires that these platforms be disassembled for shipment and reassembled at the fabrication facility.

One partial solution to the aforementioned problems is provided by the VANTAGE® platform from Applied Materials, Inc. of Santa Clara, Calif. This platform provides two processing chambers and associated sub-systems on a single frame structure that can be shipped intact for installation into the fabrication facility. This platform has a smaller footprint than its predecessors but still requires significant floor space when multiple units are needed for parallel processing schemes, due to space requirements for serviceability of the chambers and/or related systems.

Therefore, a need exists for single-substrate, multi-chamber, processing platforms with improved architecture for minimizing fabrication facility floor space requirements.

SUMMARY OF THE INVENTION

In one embodiment of the present invention, a platform for substrate processing equipment comprises a frame member having a single-substrate processing chamber attached thereto, a factory interface unit attached to the frame member adjacent the processing chamber, a power unit attached to the frame member on an end of the platform opposite the factory interface unit, and a central service corridor separating the processing chamber from the power unit, wherein the central service corridor has a length extending from a first side of the platform to a second side of the platform and a width of at least about 36 inches.

In another embodiment, a substrate processing system comprises a first single-substrate processing chamber and a second single-substrate processing chamber attached to a mainframe, a factory interface unit attached to the first and second single-substrate processing chambers having a first factory interface access panel and a second factory interface access panel disposed thereon, a first power unit and a second power unit attached to the mainframe and separated by a rear service corridor, and a central service corridor separating the first and second single-substrate processing chambers from the first and second power units. In one embodiment, the central service corridor has a length extending from a first side of the substrate processing system to a second side of the substrate processing system and a width separating the processing chamber from the power units of about 36 inches or greater.

In yet another embodiment of the present invention, a system for substrate processing equipment comprises a first single-substrate, multi-chamber processing platform having a first side and a second side with a central service corridor having a length extending from the first side of the first platform to the second side of the first platform and a width of at least about 36 inches, a second single-substrate, multi-chamber processing platform having a first side and a second side with a central service corridor having a length extending from the first side of the second platform to the second side of the second platform and a width of at least about 36 inches. In one embodiment, the second side of the first platform is juxtaposed the first side of the second platform such that the central service corridor of the first platform is substantially aligned with the central service corridor of the second platform.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention relate to improvements to single-substrate, multi-chamber processing platform architecture for minimizing fabrication facility floor space requirements. Prior art systems require significant floor space around all sides to allow for adequate installation and servicing. Embodiments of the present invention provide platforms that allow for servicing the chambers and supporting systems via a front and rear of the platform allowing multiple, side-by-side platform placement within a fabrication facility.

Figure 1:
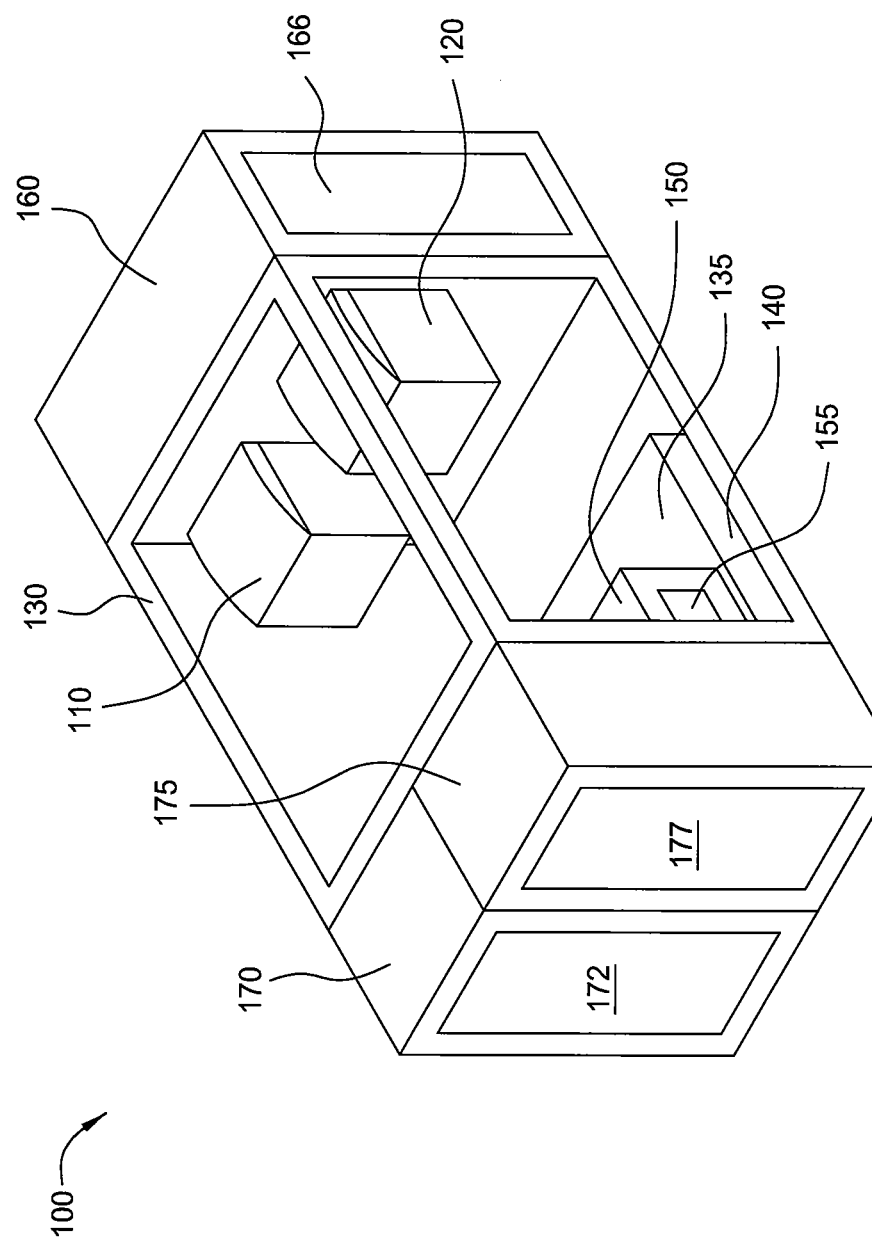
FIG. 1 is a schematic, isometric view of a prior art, single-substrate, multi-chamber platform.
Figure 2:
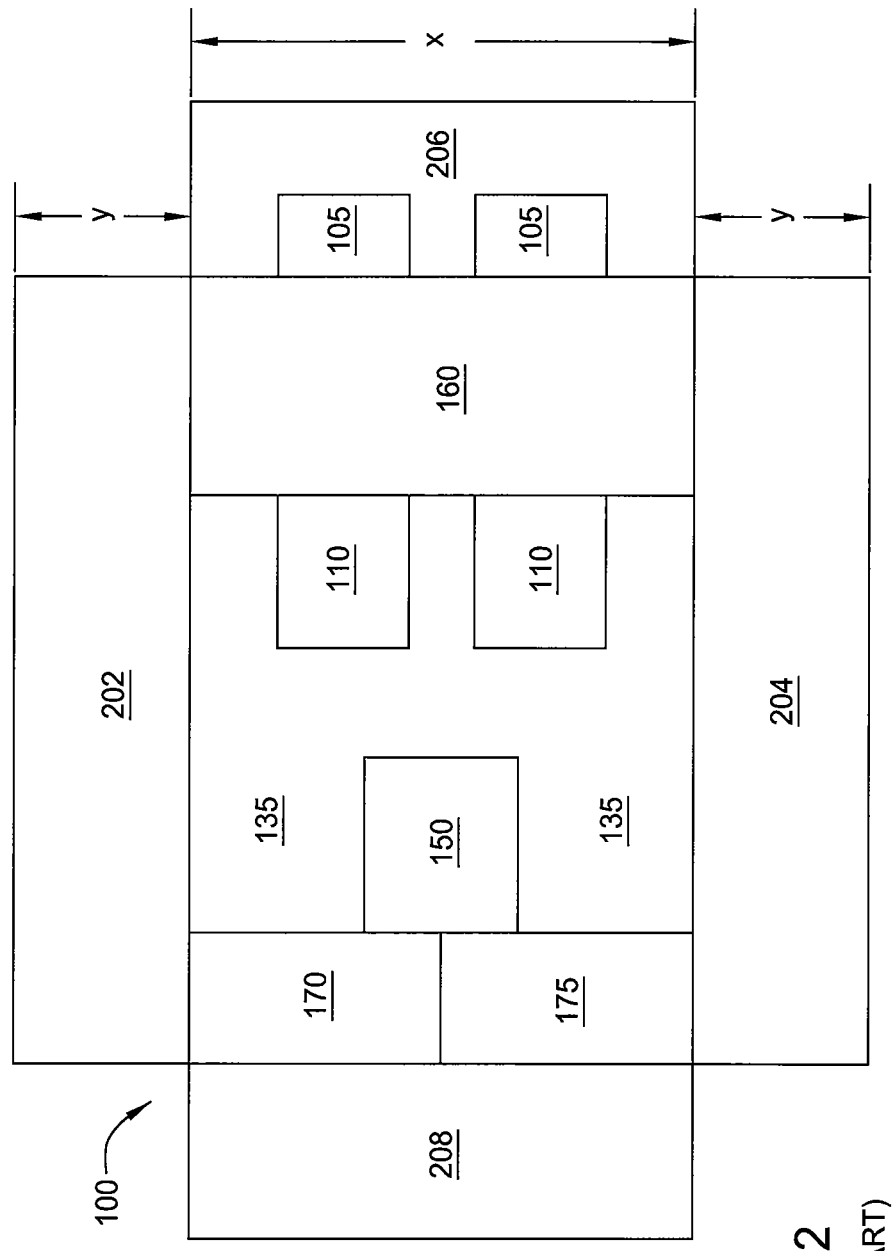
FIG. 2 is a schematic, top plan view of the prior art, single-substrate, multi-chamber platform depicted in FIG. 1.

FIG. 1 is a schematic, isometric view and FIG. 2 is a schematic top plan view of a prior art, single-substrate, multi-chamber platform 100. The platform includes two processing chambers 110, 120 mounted on a common frame 130. Controllers 140 are also mounted on the frame 130 beneath a bottom panel 135. A supply/exhaust unit 150 is mounted on the frame 130 as well. The frame 130 further attaches the processing chambers 110, 120 to a factory interface unit 160. The factory interface unit 160 typically includes a robot (not shown) to transfer substrates from a front opening unified pod (FOUP) 105 (FIG. 2) to the respective processing chamber 110, 120 through slit valves (not shown). Connection with fabrication facility gas supply and exhaust are located beneath the bottom panel 135 of the frame 130. Alternating current (AC) units 170, 175, for supplying the necessary power, are attached to the frame 130 opposite the end of the platform 100 having the factory interface 160.

In order to provide for service and maintenance of certain components located on the platform 100, a number of access panels are provided as shown in FIGS. 1 and 2. For instance, a factory interface access panel 166 is provided on each side of the factory interface 160 to provide service access to the robot (not shown) located therein as well as other supporting components contained within the factory interface 160. Additionally, an AC unit access panel 172 is located on the AC unit 170, and an AC unit access panel 177 is located on the AC unit 175 to provide service access to components of the AC units 170, 175, respectively. Further, a side panel 155 is located on either side of the supply/exhaust unit 150.

As shown in FIGS. 1 and 2, adequate access regions must be provided around certain components located on the platform 100 to allow service and maintenance of the various systems. For instance, a side access area 202 must be provided to allow access to the factory interface access panel 166 for service and maintenance of the factory interface unit 160. The side access area 202 must also allow access for servicing the processing chamber 110, the controller 140, and the supply/exhaust unit 150.

Similarly, side access area 204 must be provided to allow access to the factory interface access panel 166 for service and maintenance of the factory interface unit 160. The side access area 204 must also allow access for servicing the processing chamber 120, the controller 140, and the supply/exhaust unit 150. Additionally, front access area 206 must be provided to allow access to the FOUP's 105 as well as the front of the factory interface unit 160. Finally, rear access area 208 must be provided to allow access to AC unit access panels 172, 177 for service and maintenance of components of the AC units 170 and 175, respectively.

It should be noted that the width of the platform 100, denoted by X in FIGS. 1 and 2, is typically about 72 inches. Each of the access areas shown in FIGS. 1 and 2 must have a width (Y) of about 36 inches or more to allow for adequate access to the respective components. Therefore, each platform 100 must have at least 36 inch wide buffer region disposed around the perimeter thereof.

Figure 3:
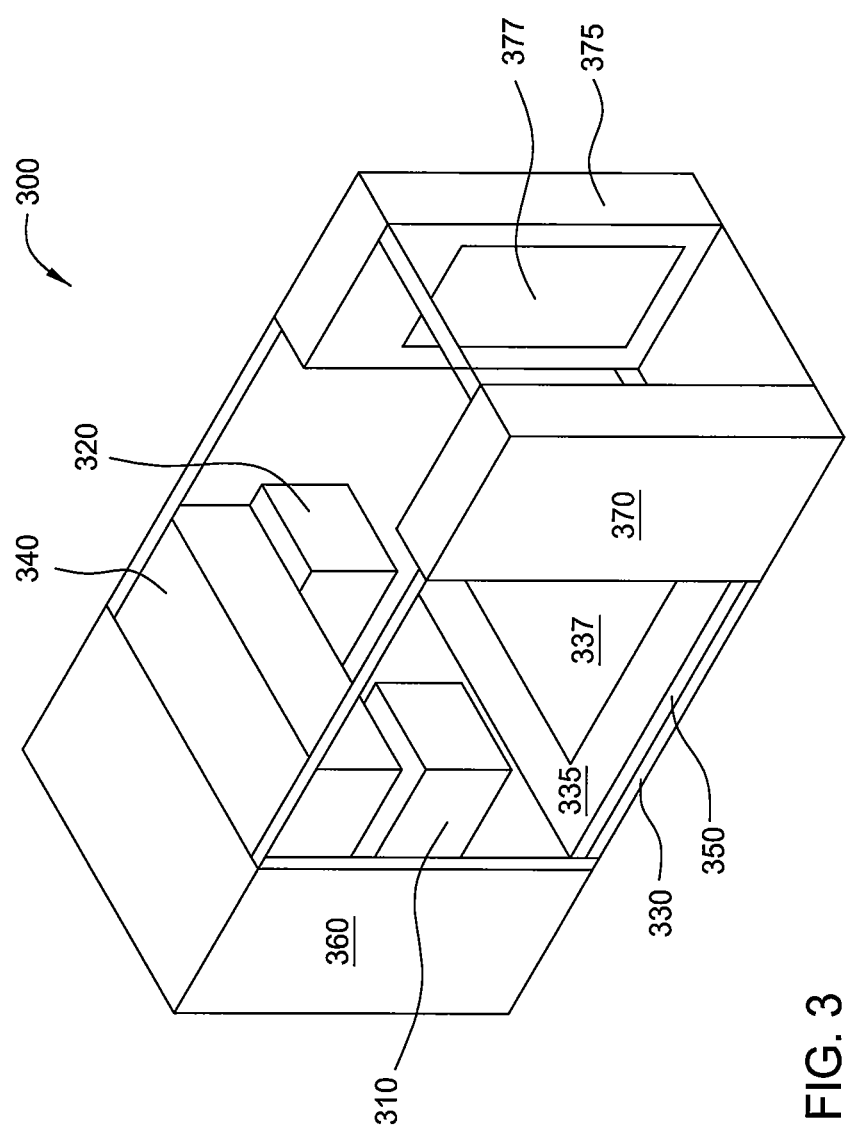
FIG. 3 is a schematic, isometric view of a single-substrate, multi-chamber platform according to one embodiment of the present invention.
Figure 4:
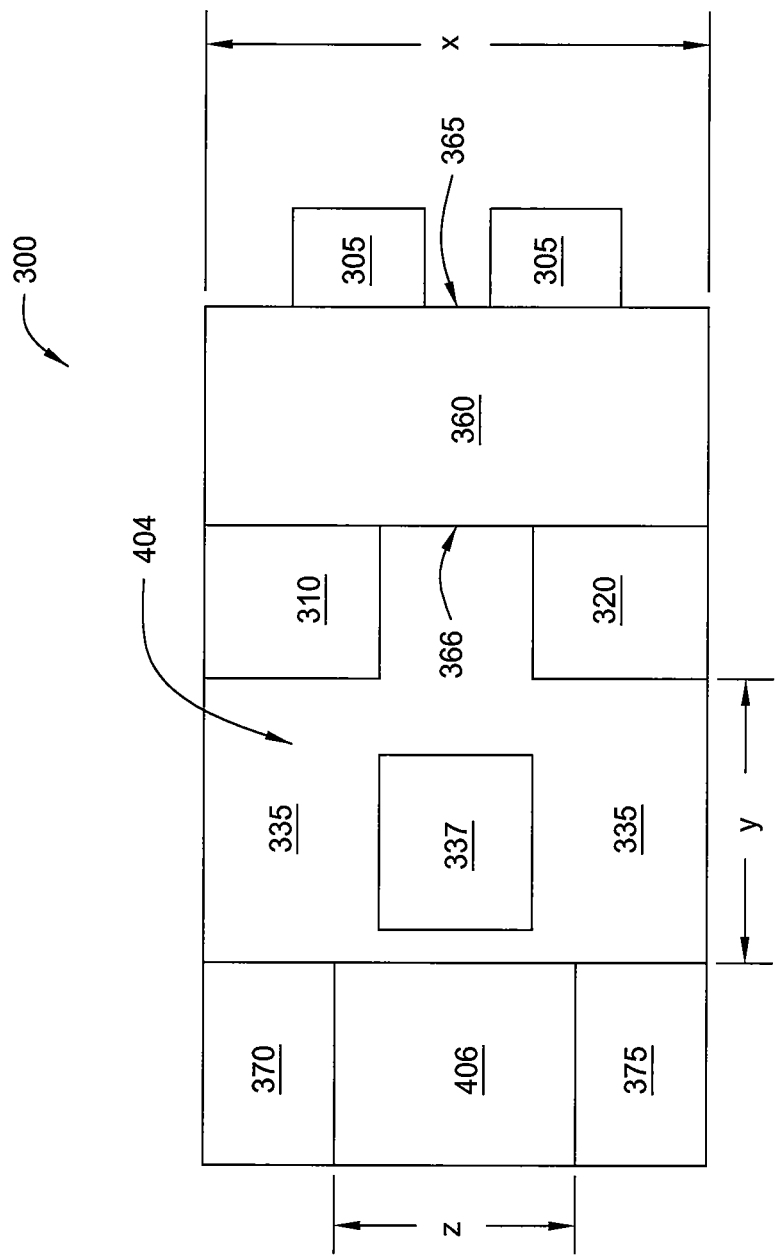
FIG. 4 is a schematic, top plan view of the single-substrate, multi-chamber platform depicted in FIG. 3.

FIG. 3 is a schematic, isometric view and FIG. 4 is a schematic top plan view of a single-substrate, multi-chamber platform 300 according to one embodiment of the present invention. In one embodiment, the platform 300 includes two processing chambers 310, 320 mounted to a common frame 330. In one embodiment, the frame 330 further attaches the processing chambers 310, 320 to a factory interface unit 360. In one embodiment, the factory interface unit 360 typically includes a robot (not shown) to transfer substrates from a FOUP 305 (FIG. 2) to the respective processing chamber 310, 320 through slit valves (not shown).

In one embodiment, controllers 340 are mounted to the frame 330 above the processing chambers 310, 320. In one embodiment, a supply/exhaust unit 350 is attached to the frame 330 and situated beneath a bottom panel 335. Connection with fabrication facility gas supply and exhaust are located beneath the bottom panel 335 of the frame 330 as well. In one embodiment, AC units 370, 375, for supplying the necessary power, are attached to the frame 330 opposite the end of the platform 300 having the factory interface 360. In one embodiment, the width Z or the platform 300 is about 72 inches.

In order to provide for service and maintenance of certain components located on the platform 300, a number of access panels are provided as shown in FIGS. 3 and 4. In one embodiment, a factory interface access panel 365, 366 is provided on the front and back sides of the factory interface 360, respectively, to provide service access to the robot (not shown) located therein as well as other supporting components contained within the factory interface 360.

In one embodiment, an AC unit access panel 377 is located on the AC unit 370, and an AC unit access panel 377 is located on the AC unit 375 to provide service access to components of the AC units 370, 375, respectively. In one embodiment, one or more floor access panels 337 are provided in the bottom panel 335 for access to supply/exhaust unit 350 as well as conduit, cables, or other components disposed thereunder.

As shown in FIGS. 3 and 4, adequate access regions must be provided around certain components located on the platform 300 to allow service and maintenance of the various systems. In one embodiment, a front access area is provided to allow access to the FOUP's 305 as well as the factory interface access panel 366 for servicing of the robot (not shown) and other components housed in the factory interface unit 360.

In one embodiment, a central service corridor 404 is provided through a central region of the platform 300 between the processing chambers 310, 320 and the AC units 370, 375. The central service corridor 404 allows access to the factory interface access panel 365 for servicing the robot (not shown) and other components housed in the factory interface unit 360. Additionally, the central service corridor allows access for servicing the processing chambers 310, 320 as well as the controllers 340. In one embodiment, the width (Y) of the central service corridor 404 is about 36 inches or more to provide adequate access for servicing the aforementioned components.

In one embodiment, a rear service corridor 406 is provided between the AC unit 370 and the AC unit 375 to allow access to the AC unit access panels 377, 377. Additionally, the rear service corridor 406 may intersect the central service corridor 404 to allow access to service the chambers 310, 320 from the rear of the platform 300. Such a configuration provides access for service carts and/or other equipment for transporting and servicing the large components of the chambers 310, 320. In one embodiment, the rear service corridor 406 has a width (Z) of at least about 42 inches to meet or exceed electrical standards for industrial machinery, such as NFPA-79.

Figure 5:
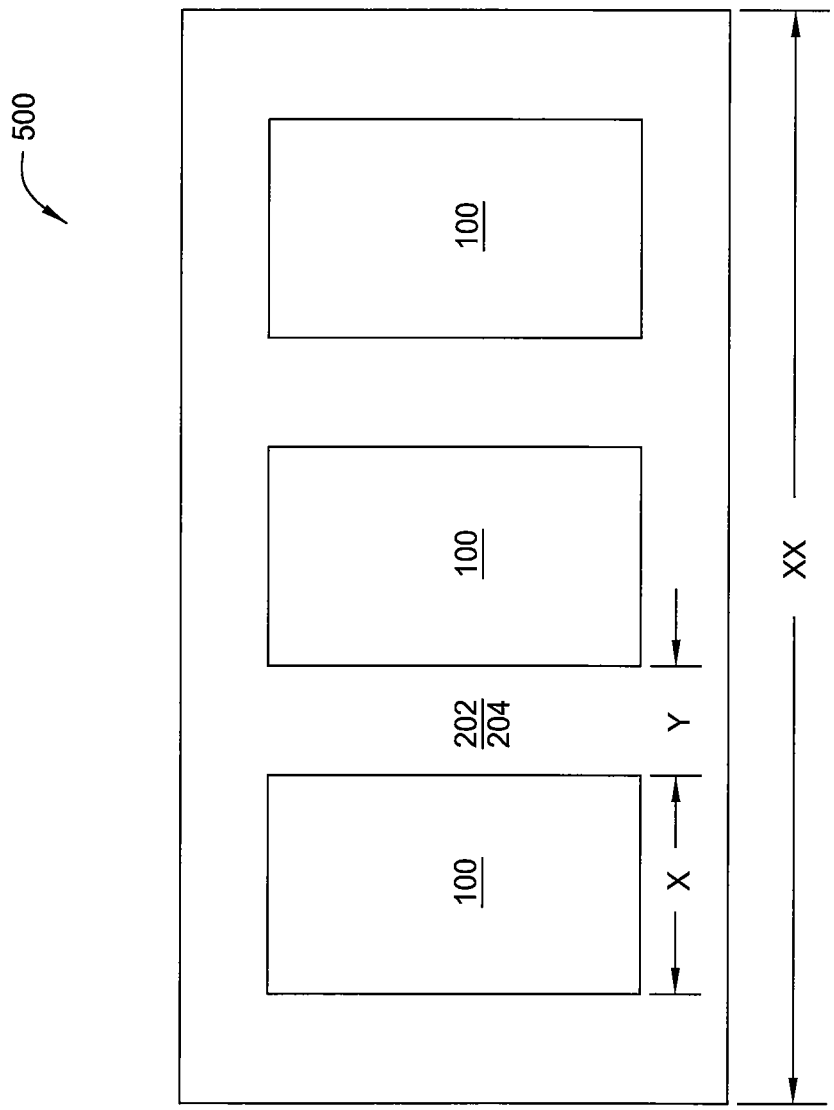
FIG. 5 is a schematic, top plan view of an exemplary fabrication facility layout utilizing the prior art platform depicted in FIG. 1.
Figure 6:
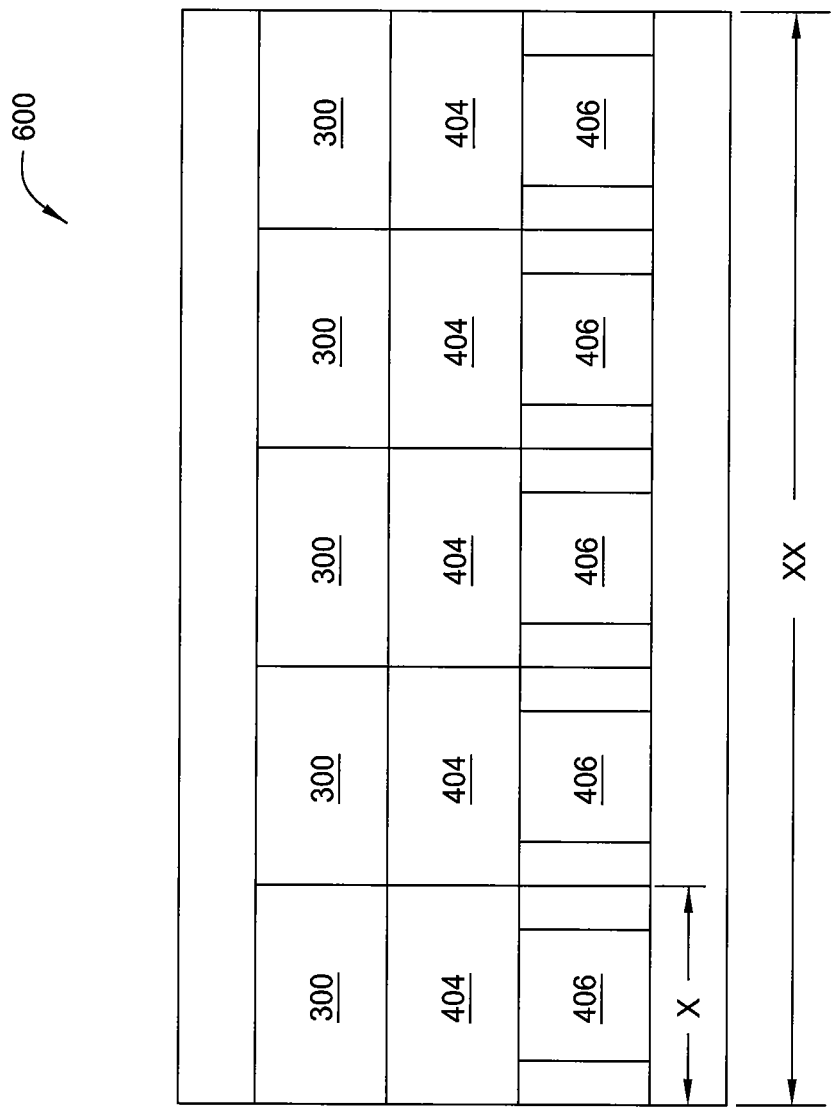
FIG. 6 is a schematic, top plan view of an exemplary fabrication facility layout utilizing the platform depicted in FIG. 3 according to one embodiment of the present invention.

FIGS. 5 and 6 are schematic, top plan views comparing a fabrication facility layout 500 of the prior art platform 100 (FIG. 5) to a fabrication facility layout 600 of the platform 300 (FIG. 6) according to one embodiment of the present invention. As previously pointed out, the platforms 100, 300 have approximately the same width (X). In one embodiment, the width (X) of each of the platforms 100, 300 is about 72 inches. Further, the prior art platform 100 requires side access areas 202, 204 having widths (Y) of about 36 inches or more on each side of the platform 100 in order to service components, such as the chambers 110, 120. This results in inefficient utilization of the available floor space in a fabrication facility. In contrast, in one embodiment, the platforms 300 are disposed in a side-by-side configuration because no "side" access is needed to service the chambers 310, 320 or other components of the platform 300. Thus, one embodiment of the present invention provides five platforms 300 occupying the same lateral footprint (XX) as three of the prior art platforms 100. Such a configuration results in significant throughput improvements without sacrificing valuable fabrication facility floor space.

Additionally, certain embodiments of the present invention may improve serviceability as well. As can be seen in FIG. 5, in order to access each chamber 110, 120 each side of the platform 100 must be accessed, requiring any service carts or equipment to be moved around the front or rear of the platform 100 between servicing each chamber 110, 120. However, in one embodiment of the present invention, the central service corridors 404 of each of the platforms 300 are aligned and open to one another. Thus, service personnel and/or equipment may move from platform 300 to platform 300 along the central service corridors 404 of each respective platform 300 from one end of the facility layout 600 to the other. Additionally, in one embodiment, each platform 300 includes a rear service corridor 406 intersecting each central corridor 404. Therefore, large carts and equipment may be transported laterally down the line accessing each of the chambers 310, 320 as needed via the rear and central corridors 404, 406, respectively.

Thus, embodiments of the present invention provide single-substrate, multi-chamber platforms that are configured to provide increased throughput of a fabrication facility while reducing the fabrication facility floor space required.

Additionally, in one embodiment of the present invention, the platforms 300 are preassembled and tested at the factory prior to shipment to the fabrication facility. Further the individual footprint of each of the platforms 300 may be such that each platform is shipped to the fabrication facility fully assembled. This allows individual docking stations to be set up at each fabrication facility layout 600 for each of the platforms 300 prior to receiving them. Once the platforms 300 are received at the fabrication facility, each platform 300 may be mated with its respective docking station allowing for reduced installation time.

While the foregoing is directed to embodiments of the present invention, other and further embodiments of the invention may be devised without departing from the basic scope thereof, and the scope thereof is determined by the claims that follow.

The invention claimed is:

1. A system for substrate processing equipment, comprising:
   a first single-substrate, multi-chamber processing platform having a first side and a second side with a central service corridor having a floor and a length extending the width of the platform from the first side of the first platform to the second side of the first platform and has a width of at least about 36 inches; and
   a second single-substrate, multi-chamber processing platform having a first side and a second side with a central service corridor having a floor and a length extending the width of the platform from the first side of the second platform to the second side of the second platform and has a width of at least about 36 inches,
   wherein the first and second platforms each have a rear service corridor having a length extending from a rear of the platform and intersecting the central service corridor, and
   wherein the second side of the first platform is adjacent the first side of the second platform thereby eliminating a side access area disposed between the first and second platform, and the central service corridor of the first platform is substantially aligned with the central service corridor of the second platform thereby forming a continuous service corridor through the adjacent aligned first and second platforms.

2. The system of claim 1, wherein the first and second platforms each have a first single-substrate processing chamber and a second single-substrate processing chamber adjacent the central service corridor and attached to a factory interface unit with an access panel separating the first and second processing chambers.

3. The system of claim 2, wherein the first and second platforms each have a first power unit disposed adjacent the central service corridor opposite the first and second single-substrate processing chambers.

4. The system of claim 3, wherein the first and second platforms each have a second power unit disposed adjacent the service corridor opposite the first and second single-substrate processing chambers.

5. The system of claim 4, wherein the rear service corridor of each platform separates the first power unit from the second power unit.

6. The system of claim 5, wherein the first power unit and the second power unit of each of the first and second platforms each have an access panel disposed adjacent the rear service corridor.

7. A system for substrate processing equipment, comprising:
   a first substrate processing platform having a first side and a second side and a central service corridor having a floor and extending from the first side to the second side of the first platform;
   a second substrate processing platform having a first side and a second side and a central service corridor having a floor and extending from the first side to the second side of the second platform, wherein the first side of the second platform is adjacent the second side of the first platform, thereby eliminating any access areas therebetween; and
   a third substrate processing platform having a first side and a second side and a central service corridor having a floor and extending from the first side to the second side of the third platform, wherein the second side of the second platform is adjacent the first side of the third platform, thereby eliminating any access areas therebetween, and wherein the central service corridor of each of the platforms are substantially aligned thereby forming a continuous service corridor through the adjacent aligned first, second and third platforms,
   wherein the first, second and third platforms each have a rear service corridor having a length extending from a rear of the platform and intersecting the central service corridor.

8. The system of claim 7, wherein the first, second and third platforms each have a first single-substrate processing chamber and a second single-substrate processing chamber adjacent the central service corridor and attached to a factory interface unit with an access panel separating the first and second single-substrate processing chambers.

9. The system of claim 8, wherein each of the first, second and third platforms have a first and second power unit disposed adjacent the service corridor opposite the first and second single-substrate processing chambers.

10. The system of claim 9, wherein the rear service corridor of each platform separates the first power unit from the second power unit.

11. The system of claim 10, wherein the rear service corridor has a width of at least about 42 inches.

12. The system of claim 5, wherein the rear service corridor has a width of at least about 42 inches.

* * * * *